United States Patent [19]
Shen et al.

[11] Patent Number: 5,386,212
[45] Date of Patent: Jan. 31, 1995

[54] DOUBLE BUFFER SCHEME FOR VARIABLE LENGTH DECODER

[75] Inventors: Paul Shen; Edward A. Krause, both of San Diego; Adam Tom, La Jolla, all of Calif.

[73] Assignee: General Instrument Corporation, Hatboro, Pa.

[21] Appl. No.: 973,429

[22] Filed: Nov. 19, 1992

[51] Int. Cl.⁶ .............................................. H03M 7/40
[52] U.S. Cl. ....................................................... 341/67
[58] Field of Search ............................. 341/67, 50, 65

[56]         References Cited
        U.S. PATENT DOCUMENTS

| | | | |
|---|---|---|---|
| 4,641,128 | 2/1987 | Immink | 341/67 X |
| 5,268,769 | 12/1993 | Tsuchiya et al. | 341/67 X |
| 5,309,156 | 5/1994 | Fujiyama | 341/67 |
| 5,321,398 | 6/1994 | Ikeda | 341/67 |

*Primary Examiner*—Sharon D. Logan
*Attorney, Agent, or Firm*—Barry R. Lipsitz

[57]          ABSTRACT

A method and apparatus are provided for decoding variable length codewords carried in data blocks. A first buffer is loaded with a succession of data blocks. A second buffer is loaded with a first data block from the first buffer during a decoding cycle. The variable length codewords from the first data block in the second buffer are decoded to recover information. The process continues, with the second buffer being loaded with one data block at a time to successively decode new data blocks during successive decoding cycles.

20 Claims, 3 Drawing Sheets

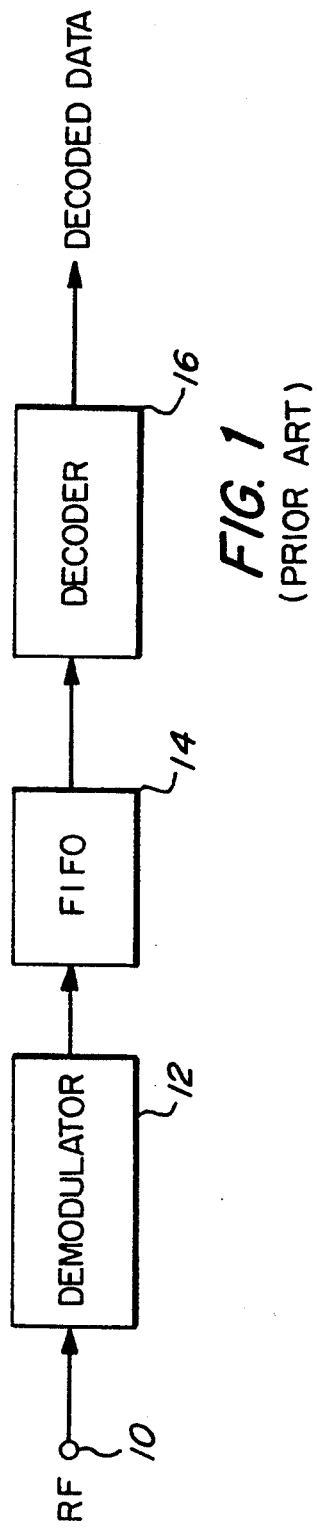
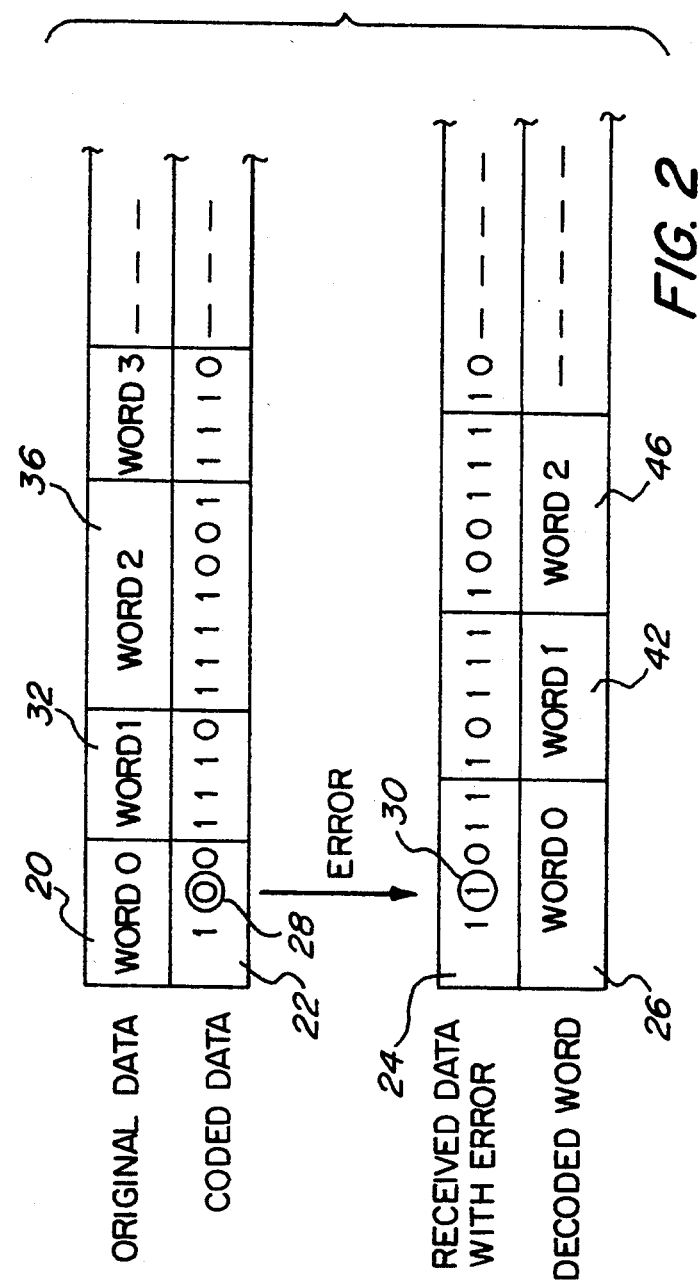

DOUBLE BUFFER SCHEME FOR VARIABLE LENGTH DECODER

BACKGROUND OF THE INVENTION

The present invention relates to the communication of digital data using variable length codewords, and more particularly to a method and apparatus for facilitating the recovery from transmission errors affecting the boundaries for data blocks containing variable length codewords.

Television signals are conventionally transmitted in analog form according to various standards adopted by particular countries. For example, the United States has adopted the standards of the National Television System Committee (NTSC). Most European countries have adopted either PAL (Phase Alternating Line) or SECAM (Sequential Color and Memory) standards.

Digital transmission of television signals can deliver video and audio services of much higher quality than analog techniques. Digital transmission schemes are particularly advantageous for signals that are broadcast by satellite to cable television affiliates and/or directly to home satellite television receivers. It is expected that digital television transmitter and receiver systems will replace existing analog systems just as digital compact discs have largely replaced analog phonograph records in the audio industry.

A substantial amount of digital data must be transmitted in any digital television system. In a digital television system, a subscriber receives the digital data stream via a receiver/descrambler that provides video, audio and data to the subscriber. In order to most efficiently use the available radio frequency spectrum, it is advantageous to compress the digital television signals to minimize the amount of data that must be transmitted.

The video portion of a television signal comprises a sequence of video "frames" that together provide a moving picture. In an interlaced transmission scheme, each frame is transmitted as two separate "fields," an even field and an odd field, which are interlaced to provide a full video frame. Such interlacing avoids the perception of flicker in the received video image. In the NTSC system, each displayed frame consists of 525 horizontally swept lines. Roughly thirty frames, corresponding to sixty fields, are displayed each second.

In digital television, each line of a video frame is defined by a sequence of digital data referred to as "pixels." A large amount of data is required to define each video frame of a television signal. For example, 5.9 megabits of data is required to provide one video frame at NTSC resolution. This assumes a 512 pixel by 480 line display that is used with eight bits of intensity value for each of the primary colors red, green and blue. High definition television (HDTV) requires even more data to provide each video frame. In order to manage this amount of data, particularly for HDTV applications, the data must be compressed.

Video compression techniques enable the efficient transmission of digital video signals over conventional communication channels. Such techniques use compression algorithms that take advantage of the correlation among adjacent pixels in order to derive a more efficient representation of the important information in a video signal. The most powerful compression systems not only take advantage of spatial correlation, but can also utilize similarities among adjacent frames to further compact the data. In such systems, differential encoding (DPCM) is used to transmit only the difference between an actual frame and a prediction of the actual frame. The prediction is based on information derived from a previous frame of the same video sequence. Examples of such systems can be found in U.S. Pat. No. 5,068,724 entitled "Adaptive Motion Compensation for Digital Television" and 5,057,916 entitled "Method and Apparatus for Refreshing Motion Compensated Sequential Video Images." A description of an HDTV broadcast system in which signals are transmitted in a compressed form is provided in W. Paik, "DigiCipher—All Digital, Channel Compatible, HDTV Broadcast System," *IEEE Transactions on Broadcasting*, Vol. 36, No. 4, December 1990, incorporated herein by reference.

Systems such as the HDTV broadcast system disclosed in the aforementioned Paik article transmit data in the form of variable length data packets ("data blocks") comprising variable length codewords (e.g., "Huffman" codewords). Since the data packets are of variable length, it is critical that the receiver have a means for distinguishing between adjacent packets. In other words, the receiver must keep track of when a current data packet ends and the next data packet starts. In the event that a transmission error occurs, which alters the expected length of a received data packet, or which causes an error in a packet length identifier transmitted with the data, synchronization at the receiver will be lost. It is important to provide a means for recovering from such transmission errors.

Often, error recovery is limited to the resynchronization of the receiver for each new video frame. By resynchronizing every frame, no more than one frame will be lost from the reconstructed video sequence. However, the reproduction of such an error in even one frame of a video image can result in a visible artifact that is unacceptable in a television picture. Concealment techniques, e.g., repeating a prior frame in lieu of a current frame in which the data has not been properly recovered, are known in the art. However, such concealment techniques will not always be effective in preventing noticeable degradations in a received video sequence.

It would be advantageous to provide a scheme for recovering from transmission errors more often than once per frame. Where date is transmitted in variable length packets, e.g., where successive blocks of quantized transform coefficients are transmitted, this would prevent an error in the length of one packet from propagating throughout the rest of the video frame. It would be still further advantageous to provide a scheme wherein each received data block is processed independently, such that the corruption of data in any one data block will not affect the processing of subsequent data blocks in the incoming data stream.

The present invention provides an error recovery scheme that enjoys the aforementioned advantages, and specifically facilitates the recovery from transmission errors within a received video frame, without waiting until a succeeding frame in order to correct the error or reacquire the video signal.

SUMMARY OF THE INVENTION

In accordance with the present invention a variable length codeword decoder is provided. First buffer means receive and store data from data blocks containing variable length codewords. Second buffer means receive and store data from the first buffer means. Means are provided for determining data block boundaries for the data stored in the first buffer means. Means are responsive to the determining means for transferring a set of data delineated by the boundaries from the first buffer means to the second buffer means. The transferred set of data is stored in the second buffer means, and comprises a subset of the data stored in the first buffer means. Means are coupled to receive the set of data from the second buffer means, for decoding the set to recover information such as transform coefficients representing video pixel information.

The transferring means can transfer successive sets of data delineated by data block boundaries from the first buffer means to the second buffer means on a cyclical basis defined by a decoding cycle. In an illustrated embodiment, the transferring means temporarily suspend the transfer of a new set of data from the first buffer means to the second buffer means until a prior decoding cycle has been completed. The second buffer means are reset after each decoding cycle. Since the second buffer means only store a subset of the data stored in the first buffer means, the second buffer means can have a storage capacity that is smaller than that of the first buffer means. For example, the second buffer means can be designed to store only one block of data at a time, so that the storage capacity thereof will only need to be at least as big as the maximum possible size of a single data block.

The second buffer means are loaded with the new data from a successive data block once each decoder cycle. In order to prevent the second buffer means from underflowing, the transferring means transfer data to the second buffer means faster than the decoding means decode the data. The transferring means will temporarily suspend the transfer of each new data block from the first buffer means to the second buffer means until the preceding decoding cycle has been completed.

The decoder can also comprise means for initializing the first buffer means. Until the initialization of the first buffer means is complete, the transferring means are inhibited from transferring data to the second buffer means. The set of data transferred to the second buffer means each cycle can comprise variable length codeword data from one of a plurality of data blocks stored in the first buffer means. In a preferred embodiment, the transferring means transfers the variable length codeword data, from successive data blocks stored in the first buffer means, to the second buffer means on a cyclical basis defined by a decoding cycle. The transfer occurs one data block at a time. In order to provide only one data block worth of data to the second buffer means each cycle, the transferring means temporarily suspend the transfer of each new data block until the prior decoding cycle has been completed. The second buffer means are reset after each decoding cycle, to prevent any commingling of data from a prior data block with a current data block. Each of the first and second buffer means can comprise a first-in, first-out (FIFO) register.

A method in accordance with the present invention decodes variable length codewords carried in data blocks. A first buffer is loaded with a succession of data blocks. A second buffer is loaded with a first data block from the first buffer during a decoding cycle. The variable length codewords from the first data block stored in the second buffer are decoded to recover information. The second buffer loading step and the decoding step are repeated to successively decode new data blocks received by the second buffer from the first buffer during successive decoding cycles.

In a preferred embodiment, the second buffer is loaded with data faster than the data is decoded during the decoding step. The loading of a new data block from the first buffer to the second buffer is temporarily suspended until the prior decoding cycle has been completed. The second buffer is reset after each decoding cycle. Prior to the commencement of decoding, the first buffer is initialized to remove any data therefrom. The loading of the first data block to the second buffer is inhibited until the initialization of the first buffer is complete.

BRIEF DESCRIPTION OF THE DRAWINGS

FIG. 1 is a block diagram of a prior art decoding scheme in which only a single FIFO is provided as a buffer;

FIG. 2 is a diagrammatic illustration showing how an error in a received variable length codeword causes a decoder to incorrectly decode succeeding received words;

DETAILED DESCRIPTION OF THE INVENTION

In digital communication systems, such as HDTV systems, data is typically packed into blocks. The data within each block is often encoded to provide variable length codewords. One technique for providing variable length codewords is to use a Huffman encoder as well known in the art.

In a variable length encoding system, the coded data not only carries the meaning which it represents (i.e., information such as amplitude), but also carries information as to its own length. If there is an error in a codeword, for example due to transmission noise, it is likely that all of the following data will not be correctly decoded. Specifically, the failure in decoding will result because the data pointer for the data after the error will not be in the correct position.

A conventional prior art implementation for a variable length decoder is illustrated in FIG. 1. A radio frequency (RF) signal carrying information to be decoded is input to a demodulator 12 via terminal 10. The demodulator recovers the variable length codewords from the RF signal, and presents them to a FIFO 14 which serves as a data buffer. The data is output from the FIFO to a decoder 16 that is intended to recover the coded data from the variable length codewords. The output data rate of the variable length decoding unit is generally constant.

Although the prior art structure of FIG. 1 performs well in the absence of errors in the received data, errors will normally occur. For example, channel noise and nonlinearity of the transmission channel can create errors in a received data stream. When error corrupted codewords are decoded by the variable length decoder 16, the decoded results are likely to be different from the original data that the codewords are intended to represent. If there are errors in a coded data block, it is unlikely that the total number of bits generated by decoder 16 will equal the number of bits contained in the block at the encoder. As a result, the next block at the decoder will not start at the correct position.

Figure 3:
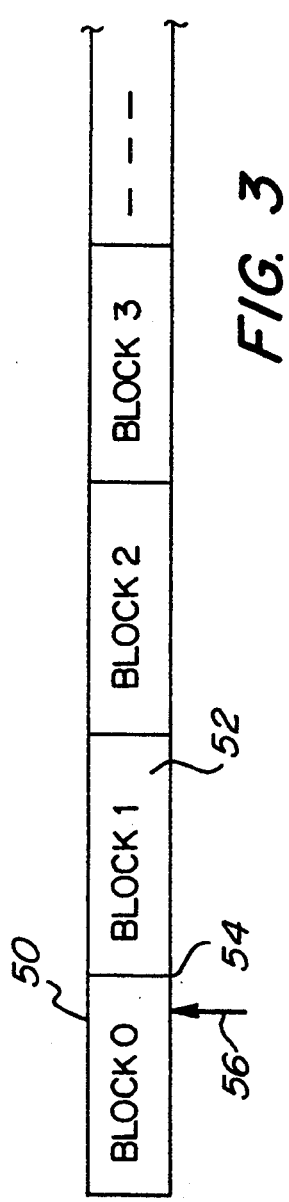
FIG. 3 is a diagrammatic illustration showing how the received error illustrated in FIG. 2 can affect the designated locations of data block boundaries in a succession of received data blocks.

The results of such a data error are illustrated in FIGS. 2 and 3. In FIG. 2, an Original data word 20 comprises coded data 22 having the three bit pattern 1 0 0. If an error occurs in the second zero (designated by reference numeral 28), the received data 24 will comprise the erroneous data bit indicated by reference numeral 30. Thus, the decoded word 26 will not be the same as the original data word 20 that was intended to be sent. This will usually result in a decoded word that has a different length than the original data transmitted for that word. This is illustrated in FIG. 2, wherein decoded word 26 contains five bits whereas the original data 20 only contained three bits. Thus, although the only difference between the coded data and received data illustrated in FIG. 2 is the error between bits 28 and 30, the decoded words 26, 42, 46 are entirely different than the original words 20, 32, 36.

Where a plurality of variable length codewords are transmitted in block form, the error illustrated in FIG. 2 will affect the overall length of a decoded block. This is illustrated in FIG. 3, where block 0 (reference number 50) is supposed to end at data boundary 54. However, since the total number of bits in the decoded block is less than the actual number of bits for that block, the decoded boundary will incorrectly be at the point illustrated by data pointer 56. As a result, block 1 (designated by reference numeral 52) will not start at the correct position. From this point on, there is no way to recover the correct position of the data pointer 56. The only solution is to flush out the whole FIFO 14 and reinitialize it. In the case of a decoder for HDTV, this will take at least one frame time. This can result in unacceptable artifacts in the decoded video, and is a major disadvantage of using a FIFO as illustrated in FIG. 1 as the input buffer in a variable length decoder.

Figure 4:
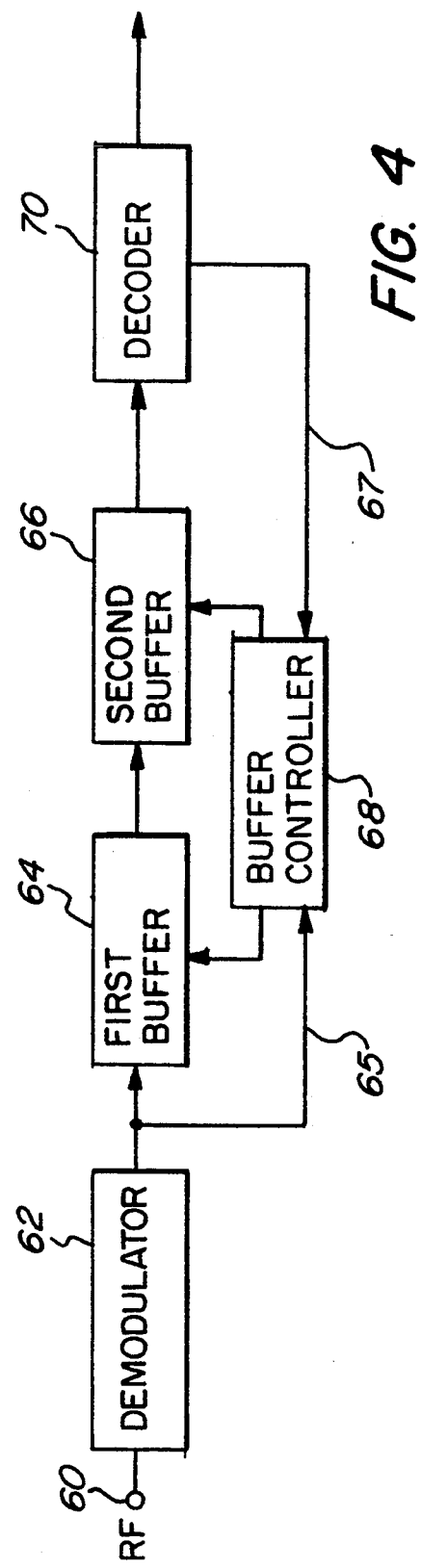
FIG. 4 is a block diagram illustrating decoder apparatus in accordance with the present invention.

In order to overcome this disadvantage, the present invention provides a new buffer architecture for a variable length decoder. In particular, the present invention provides a pair of buffers as illustrated in FIG. 4. As in the prior art, the transmitted variable length codewords input to terminal 60 from an RF carrier signal are demodulated in a demodulator 62. However, unlike the prior art, the codewords are then input to a first buffer 64 for subsequent loading into a second buffer 66 under the direction of a buffer controller 68. The variable length codewords are output from second buffer 66 to a conventional decoder 70. First buffer 64 and second buffer 66 can comprise FIFOs. First buffer 64 functions in the same way as the FIFO 14 illustrated in FIG. 1. However, it is not reset during normal operation, even if there are errors in the received data. All of the incoming uncoded data is kept in first buffer 64.

Second buffer 66 is smaller than first buffer 64. Where processing is to occur on a block-by-block basis, second buffer 66 only has to have a storage capacity that is sufficient to store the maximum size of a block. In a preferred embodiment, the second buffer stores only one block of undecoded data at a time, for decoding by decoder 70. Unlike first buffer 64, second buffer 66 is reset by buffer controller 68 at the beginning of the decoding process for each new block.

When a new block is to be decoded, the undecoded data for that block is read out from first buffer 64 into second buffer 66 at a speed which is equal to or higher than the decoding speed. This transfer process is stopped when the data in the first buffer 64 reaches the beginning of the next block. This enables decoder 70 to complete the decoding of the block stored in second buffer 66 during one decoder cycle.

At the commencement of the next decoder cycle, the transfer cycle from first buffer 64 to second buffer 66 is restarted, and the next data block is written into second buffer 66 under the control of buffer controller 68. Buffer controller 68 receives the undecoded data via line 65, and determines from this data the boundaries between each successive data block. For example, the incoming data can contain information as to the starting position of each successive data block, which defines the data block boundaries. Based on this information, buffer controller 68 can enable first buffer 64 to transfer data to second buffer 66 at the commencement of each new data block, and to terminate the transfer at the end of the data block until the next decoding cycle starts. The commencement of each decoding cycle is communicated to buffer controller 68 from decoder 70 via line 67.

In a preferred embodiment of the present invention, the data is packed into blocks. When the system is in normal operation, it is synchronized, such that the receiver has the knowledge of the start point and end point of every received block. All of the blocks are numbered. In an HDTV embodiment, the blocks can be labeled, for example, from 0 to 59 for each video frame. The block number is provided at the beginning of each block of incoming data.

When the decoder is first turned on, or if disruption of data occurs in the transmission channel, the data in the first buffer 64 will be meaningless, and the buffer will have to be resynchronized. The resynchronizing process (i.e., FIFO initialization) is commenced by resetting first buffer 64 to insure that there is no data left therein. The system then waits for a known signal, such as a beginning of frame signal in an HDTV implementation. Upon receipt of the known signal, writing of the received data into first buffer 64 is commenced. Thus, for example, the first block of a given frame of video data will be written into first buffer 64, followed by the second block of that frame, etc. While this is occurring, the decoding process is disabled.

Since the data in first buffer 64 is not read out during the initialization process, the data at the beginning of the first buffer will comprise the first data block. When the time comes to decode the first block of the current video frame, data is read out from first buffer 64 and written into second buffer 66 under the control of buffer controller 68. The transfer cycle stops when the data read out of first buffer 64 reaches the end of the first block. Decoder 70 then decodes the first block of data from second buffer 66. At the commencement of the next decoding cycle, the transfer of the next data block from first buffer 64 to second buffer 66 will resume, and the second block will be decoded. As indicated above, in order to ensure that the second buffer does not underflow, the transfer rate from the first buffer must be equal to or greater than the decoding rate.

The decoding process starts after the first byte, or first few bytes of data of a given block have been written into second buffer 66. Decoder 70 will continuously decode at a predetermined rate. The decoding operation for each block will stop at the end of that block.

Decoding resumes at the same rate for the next block during the next decoding cycle.

In the structure according to the present invention, the operation of reading data from first buffer 64 is independent of the variable length decoding provided by decoder 70. Thus, any error in the data stream which affects the decoding process will not affect the synchronization of first buffer 64. At the beginning of each new block, the undecoded data that is to be read out of first buffer 64 is always synchronized. There is no need to reset first buffer 64 every time an error occurs, as was necessary in the prior art structure of FIG. 1. Only the second buffer 66 is reset for each decoding cycle, and corruption of first buffer 64 by decoding errors is completely avoided.

Figure 5:
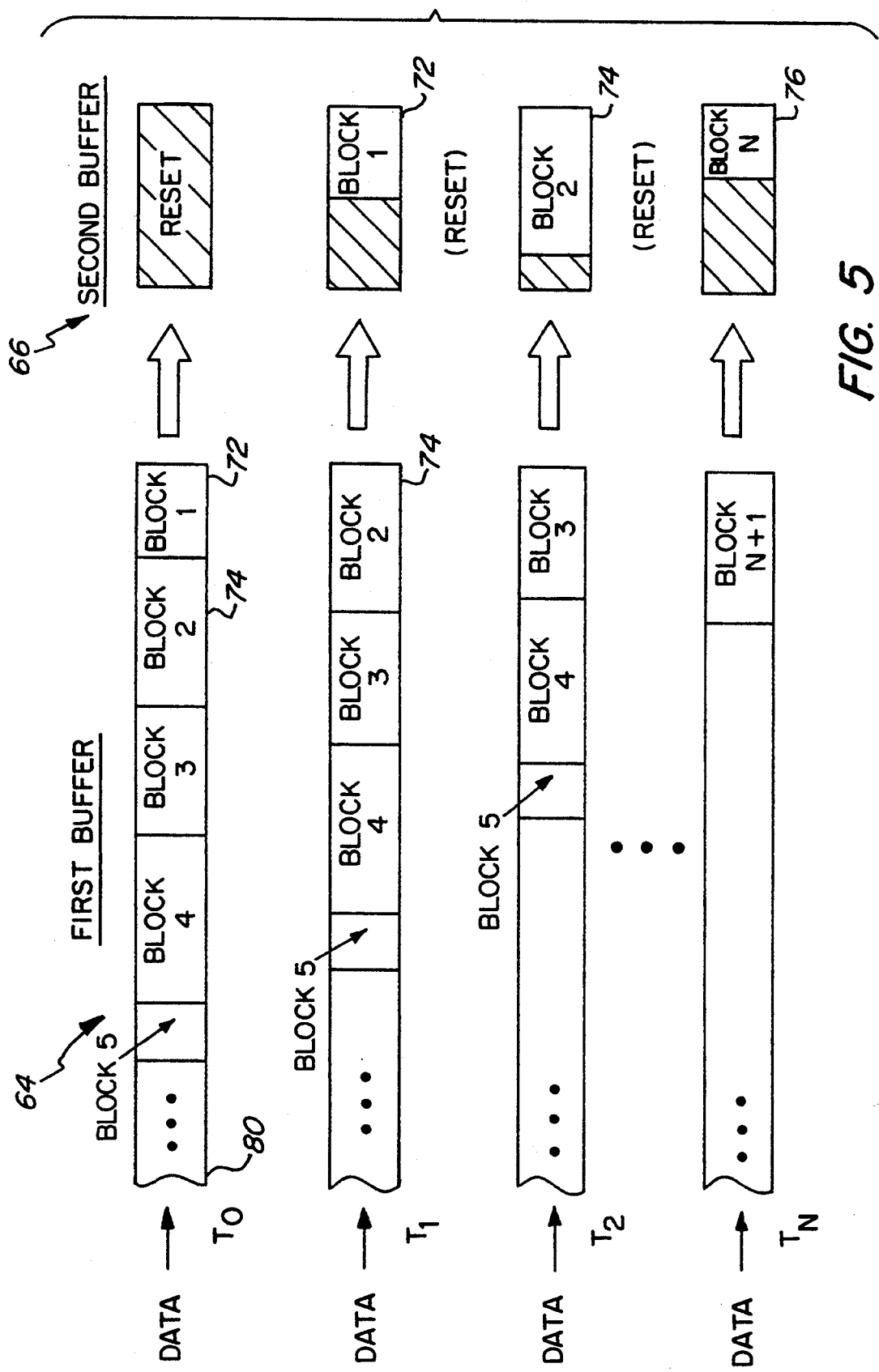
FIG. 5 is a diagrammatic illustration showing how the double buffer scheme of the present invention is used to prevent errors in the received data for a data block from corrupting the decoding of subsequent data blocks.

FIG. 5 illustrates the operation of the first and second buffers during successive decoding cycles. The first buffer receives data at an input end 80 and accumulates a plurality of successive data blocks on a first-in first-out basis. At time $T_0$, the first data block 72 is ready to be output from the first buffer. The second buffer has been reset and contains no data. As noted above, second buffer 66 needs only to have sufficient storage capacity for the maximum block size.

At time $T_1$, the first data block 72 has been transferred to the second buffer. The transfer is stopped at the block boundary between first block 72 and second block 74. The second block is ready to be transferred to the second buffer upon the completion of the decoding of first block 72. After the first block has been decoded, the second buffer is reset, and at time $T_2$ the second block 74 has been loaded into the second buffer. Since the second block is larger than the first block, it occupies more space in the second buffer. However, as long as the second buffer is large enough to accommodate the maximum block size, it will not overflow.

After the second block has been decoded, the second buffer is again reset and at time $T_N$, the nth block 76 will be loaded into the second buffer. The process continues in this manner indefinitely.

As can be seen from FIG. 5, even if the data in a particular block has been corrupted, the decoding of only that one block will be affected. Each remaining block is safely held in the first buffer, with the block boundaries having been properly identified by buffer controller 68. In the event that a data error results in the incorrect determination of a block boundary, all subsequent blocks will remain intact. In the event that a block boundary error causes the second buffer to overflow during one decoding cycle, subsequent decoding cycles will not be affected.

It should now be appreciated that the present invention provides an improved error protection scheme for use in a variable length decoder. Two separate buffers are provided. A first buffer receives and stores incoming data. A second buffer receives successive subsets of the incoming data during successive decoding cycles. Since the transfer of data from the first buffer to the second buffer is independent of the variable length decoding, the synchronization of the first buffer is not affected by errors in the data stream that result in incorrect decoding.

Although the invention has been described in connection with a specific embodiment thereof, those skilled in the art will appreciate that numerous adaptations and modifications may be made thereto without departing from the spirit and scope of the invention as set forth in the claims.

We claim:

1. A variable length codeword decoder comprising:
   first buffer means for receiving and storing data from data blocks containing variable length codewords;
   second buffer means for receiving and storing data from said first buffer means;
   means for determining data block boundaries for the data stored in said first buffer means;
   means responsive to said determining means for transferring a set of data delineated by said boundaries from said first buffer means to said second buffer means for storage in said second buffer means, wherein said set of data is a subset of the data stored in said first buffer means; and
   means coupled to receive said set of data from said second buffer means, for decoding said set to recover information.

2. A decoder in accordance with claim 1 wherein said transferring means transfers successive sets of data delineated by data block boundaries from said first buffer means to said second buffer means on a cyclical basis defined by a decoding cycle.

3. A decoder in accordance with claim 2 wherein said transferring means temporarily suspend the transfer of a new set of data from said first buffer means to said second buffer means until a prior decoding cycle has been completed.

4. A decoder in accordance with claim 3 further comprising means for resetting said second buffer means after each decoding cycle.

5. A decoder in accordance with claim 4 wherein said second buffer means has a storage capacity that is smaller than said first buffer means.

6. A decoder in accordance with claim 5 wherein the storage capacity of said second buffer means is about equal to the maximum possible size of a single data block.

7. A decoder in accordance with claim 6 wherein said transferring means transfer data to said second buffer means faster than said decoding means decode said data.

8. A decoder in accordance with claim 1 wherein said transferring means transfer data to said second buffer means faster than said decoding means decode said data.

9. A decoder in accordance with claim 1 further comprising:
   means for initializing said first buffer means; and
   means for inhibiting said transferring means from transferring data to said second buffer means until the initialization of said first buffer means is complete.

10. A decoder in accordance with claim 1 wherein said set of data comprises variable length codeword data from one of a plurality of data blocks stored in said first buffer means.

11. A decoder in accordance with claim 10 wherein said transferring means transfers variable length codeword data from successive data blocks stored in said first buffer means to said second buffer means on a cyclical basis defined by a decoding cycle, one data block at a time.

12. A decoder in accordance with claim 11 wherein said transferring means temporarily suspend the transfer of each new data block from said first buffer means to said second buffer means until a prior decoding cycle has been completed.

13. A decoder in accordance with claim 12 further comprising means for resetting said second buffer means after each decoding cycle.

14. A decoder in accordance with claim 13 wherein said second buffer means have a storage capacity designed to hold one data block at a time.

15. A decoder in accordance with claim 11 wherein said transferring means transfer data to said second buffer means faster than said decoding means decode said data.

16. A decoder in accordance with claim 1 wherein said first and second buffer means comprise first-in first-out registers.

17. A method for decoding variable length codewords carried in data blocks comprising the steps of:

loading a first buffer with a succession of said data blocks;

loading a second buffer means with a first data block from said first buffer during a decoding cycle;

decoding the variable length codewords from the first data block in said second buffer to recover information; and repeating said second buffer loading step and said decoding step to successively decode new data blocks received by said second buffer from said first buffer during successive decoding cycles.

18. A method in accordance with claim 17 wherein said second buffer is loaded with data faster than the data is decoded during said decoding step, said method comprising the further step of:

temporarily suspending the loading of a new data block from said first buffer to said second buffer until a prior decoding cycle has been completed.

19. A method in accordance with claim 18 comprising the further step of resetting said second buffer after each decoding cycle.

20. A method in accordance with claim 17 comprising the further steps of:

initializing said first buffer; and inhibiting the loading of said first data block to said second buffer until the initialization of said first buffer is complete.

* * * * *